United States Patent
Chang (10) Patent No.: US 10,374,267 B2
(45) Date of Patent: Aug. 6, 2019

(54) BATTERY STATUS DETECTION METHOD AND NETWORK DEVICE USING THE SAME

(71) Applicant: Sercomm Corporation, Taipei (TW)

(72) Inventor: Chien-Yu Chang, Taipei (TW)

(73) Assignee: SERCOMM CORPORATION, Taipei (TW)

( * ) Notice: Subject to any disclaimer, the term of this patent is extended or adjusted under 35 U.S.C. 154(b) by 0 days.

(21) Appl. No.: 15/370,086

(22) Filed: Dec. 6, 2016

(65) Prior Publication Data

US 2017/0192063 A1 Jul. 6, 2017

(30) Foreign Application Priority Data

Jan. 6, 2016 (CN) .......................... 2016 1 0004761

(51) Int. Cl.
*G01R 31/3835* (2019.01)
*G01R 19/165* (2006.01)
*H01M 10/48* (2006.01)
*H02J 7/00* (2006.01)
*G01R 31/367* (2019.01)

(52) U.S. Cl.
CPC ...... *H01M 10/48* (2013.01); *G01R 19/16542* (2013.01); *G01R 31/3835* (2019.01); *H02J 7/0021* (2013.01); *H02J 7/0029* (2013.01); *H02J 7/0047* (2013.01); *G01R 19/16557* (2013.01); *G01R 31/367* (2019.01); *H02J 2007/004* (2013.01); *H02J 2007/005* (2013.01)

(58) Field of Classification Search
CPC .............. G01R 31/3686; G01R 31/362; G01R 31/3835; G01R 19/16542; G01R 19/16557

USPC ......................................................... 324/433
See application file for complete search history.

(56) References Cited

U.S. PATENT DOCUMENTS

| | | | |
|---|---|---|---|
| 6,313,606 B1 | 11/2001 | Eguchi | |
| 8,635,038 B2* | 1/2014 | Benjamin | G01R 31/3658 320/104 |
| 9,465,084 B2 | 10/2016 | Park | |
| 2008/0197707 A1* | 8/2008 | Chi Yang | H02J 7/0068 307/71 |
| 2012/0029851 A1 | 2/2012 | Nakayama et al. | |

(Continued)

FOREIGN PATENT DOCUMENTS

| | | |
|---|---|---|
| CN | 102298119 A | 12/2011 |
| CN | 102476104 A | 5/2012 |

(Continued)

OTHER PUBLICATIONS

CN Office Action dated Mar. 6, 2018 in corresponding Chinese application (No. 201610004761.3).

(Continued)

*Primary Examiner* — Reena Aurora
(74) *Attorney, Agent, or Firm* — McClure, Qualey & Rodack, LLP (57) ABSTRACT

The present invention provides a battery status detection method, which includes the following steps: iteratively executing the following steps: obtaining a current voltage value and a previous voltage value of a battery; calculating a difference between the current voltage value and the previous voltage value; adjusting a low battery state indicator according to the difference; and determining whether to output a low battery warning signal according to the low battery state indicator.

14 Claims, 5 Drawing Sheets

(56) References Cited

U.S. PATENT DOCUMENTS

2014/0147713 A1* 5/2014 Mizobe ................ G01R 31/362
    429/90
2015/0168501 A1* 6/2015 Simeth ............... G01R 31/3606
    324/428

FOREIGN PATENT DOCUMENTS

| CN | 102830361 A | 12/2012 |
| CN | 102944849 A | 2/2013 |
| CN | 103001288 A | 3/2013 |
| CN | 103323773 A | 9/2013 |
| CN | 102645636 B | 5/2014 |
| CN | 104849667 A | 8/2015 |

OTHER PUBLICATIONS

CN Office Action dated Aug. 17, 2018 in corresponding Chinese application (No. 201610004761.3).

\* cited by examiner

BATTERY STATUS DETECTION METHOD AND NETWORK DEVICE USING THE SAME

This application claims the benefit of People's Republic of China application Serial No. 201610004761.3, filed Jan. 6, 2016, the disclosure of which is incorporated by reference herein in its entirety.

TECHNICAL FIELD

The present invention relates to a battery status detection method and a network device using the same.

BACKGROUND

Conventionally, battery voltage is an indicator to determine whether a battery has entered a low battery state. That is, when the battery voltage is detected to be lower than a threshold, the battery is considered as being in the low battery state.

However, after a battery enters the low battery state, the battery voltage would rapidly decline, thus the remaining battery life is extremely limited. This is unfavorable for applications such as wearable devices for long time usages, environmental sensors, or other miniature devices.

Therefore, there is a need to provide a technology capable of warning that a battery is about to enter the low battery state in advance.

SUMMARY

One of the purposes of the present invention is to provide a battery status detection method and a network device using the same, utilizing the voltage jitter property occurred when a battery approaches the low battery state as a basis for determining whether the battery is near the low battery state, thereby providing low battery warnings in advance.

The present invention provides a battery status detection method including: iteratively executing the following steps: obtaining a current voltage value and a previous voltage value of a battery; calculating a difference between the current voltage value and the previous voltage value; adjusting a low battery state indicator according to the difference; and determining whether to output a low battery warning signal according to the low battery state indicator.

The present invention further provides a battery status detection method including: detecting voltage of a battery to obtain a current voltage value and a previous voltage value of the battery; determining whether a difference between the current voltage value and the previous voltage value is greater than or equal to a first threshold; adjusting the value of a low battery state indicator when the difference is greater than or equal to the first threshold; and outputting a low battery warning signal when the value of the low battery state indicator crosses a second threshold.

The present invention further provides a network device for battery status detection, which includes a transmitting circuit, a voltage sensor and a determination logic circuit. The voltage sensor is configured to detect voltage of a battery. The determination logic circuit is configured to iteratively obtain a current voltage value and a previous voltage value of the battery from the voltage sensor, calculate a difference between the current voltage value and the previous voltage value, adjust the value of a low battery state indicator according to the difference, and determine whether to control the transmitting circuit to output a low battery warning signal according to the low battery state indicator.

The above and other aspects of the invention will become better understood with regard to the following detailed description of the preferred but non-limiting embodiment(s). The following description is made with reference to the accompanying drawings.

DETAILED DESCRIPTION

A number of embodiments are disclosed below for elaborating the invention. However, the embodiments of the invention are for detailed descriptions only, not for limiting the scope of protection of the invention. Furthermore, secondary or less relevant elements are omitted in the accompanying diagrams of the embodiments for highlighting the technical features of the invention.

The battery status detection method and the network device proposed in the present invention utilize the voltage jitter property occurred when a battery approaches the low battery state as a basis for determining whether to warn that the battery is about to enter the low battery state in advance.

Figure 1:
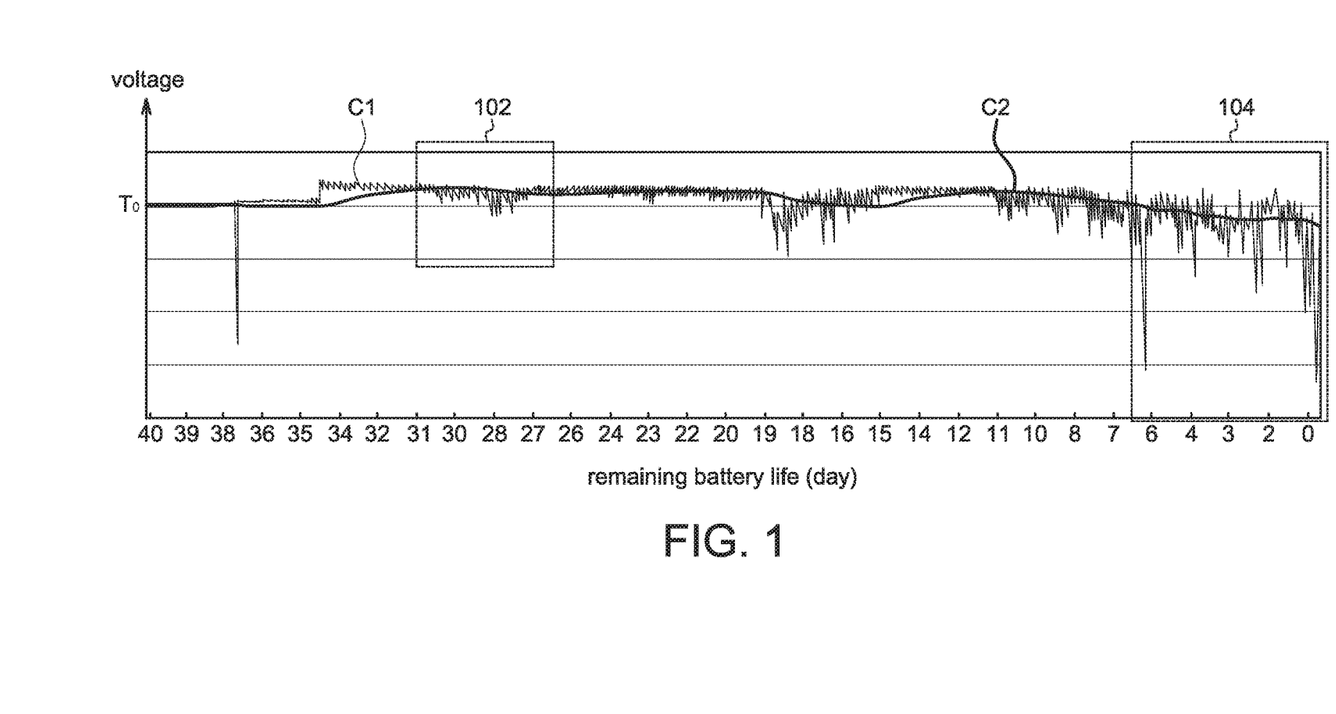
FIG. 1 illustrates an example curve of battery voltage with respect to the remaining battery life.

FIG. 1 illustrates an example curve of battery voltage with respect to the remaining battery life. The curve C1 indicates the instantaneous battery voltage. The curve C2 indicates the average battery voltage. $T_0$ is the voltage threshold. When the curve C2 is lower than the threshold $T_0$, the battery enters the low battery state, as shown in block 104. Under the low battery state, the battery voltage would rapidly decline. In this example, when the battery enters the low battery state, only 6-7 days of usable battery life remain.

Our research shows that before the battery enters the low battery state, more frequent voltage jitters are first occurred. As shown in block 102 of FIG. 1, the apparent continuous change in the battery voltage is first occurred within the time interval of block 102, i.e., the voltage jitter phenomenon. This property can be used to detect that the battery is about to enter the low battery state. For example, if the voltage jitter phenomenon is detected and warnings are produced during the time interval of block 102, about 30-31 days of usable battery life would still remain. This is still approximately 24-25 days before the battery truly enters the low battery state. The user will have more sufficient time for battery replacement or other preparations.

Figure 2:
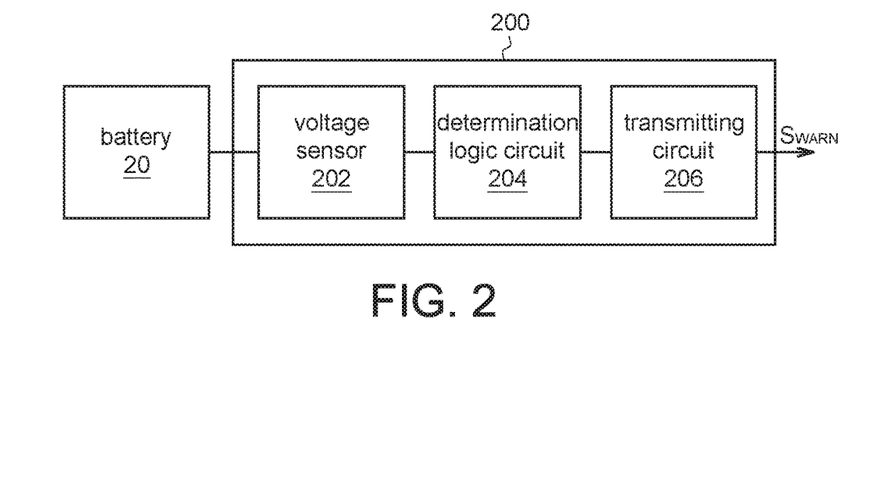
FIG. 2 shows a simplified block diagram of a network device for battery status detection according to an embodiment of the present invention.
Figure 3:
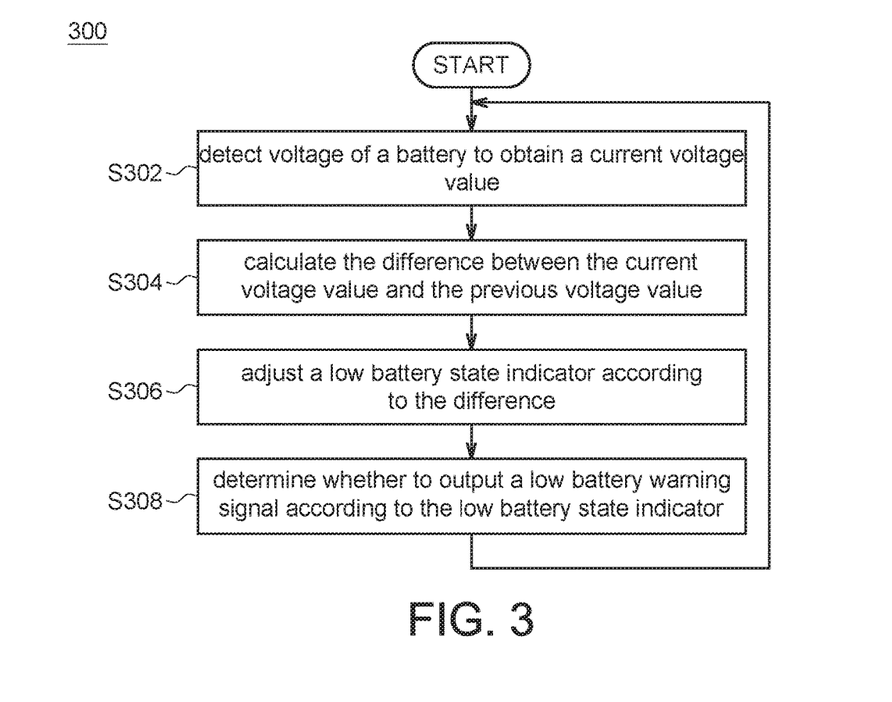
FIG. 3 shows a flowchart of a battery status detection method according to an embodiment of the present invention.

Please refer to FIGS. 2 and 3. FIG. 2 shows a simplified block diagram of a network device 200 for battery status detection according to an embodiment of the present invention. FIG. 3 shows a flowchart 300 of a battery status detection method according to an embodiment of the present invention. The network device 200 includes a voltage sensor 202, a determination logic circuit 204 and a transmitting circuit 206. For example, the network device 200 is a sensor, a wearable device or any other miniature device powered by battery. The network device 200 has the ability to access to the communication network (e.g., wireless communication network) and use it to transmit data. The voltage sensor 202 includes, for example, an analog to digital converter (ADC) capable of outputting the results of detected battery voltages in digital signals. The voltage sensor 202 can be other kinds of sensing element, which can output the detected battery voltage results in analog or digital signals. The determination logic circuit 204 couples to the voltage sensor 202. The determination logic circuit 204 can be implemented by a microprocessor, a microcontroller, an application-specific circuit, or any other computation control circuit. The transmitting circuit 206 couples to the determination logic circuit 204. For example, the transmitting circuit 206 includes a transmitter capable of outputting a low battery warning signal $S_{WARN}$ of the network device 200 by using audio, optical, wireless, or wired signals.

FIG. 3 shows an operation flowchart 300 of the network device 200 according to an embodiment of the present invention. For example, the network device 200 may iteratively execute the processes in the operation flowchart 300, so as to continuously detect the status of the battery 20.

In step S302, the voltage sensor 202 detects voltage of the battery 20 to obtain a current voltage value. For example, the battery 20 is a button cell battery, or any other battery suitable for wearable devices, sensors or miniature devices. Whenever a new voltage value is obtained, it's treated as the current voltage value and its previous value would be treated as a previous voltage value.

In step S304, the determination logic circuit 204 calculates the difference between the current voltage value and the previous voltage value. The difference can be, for example, an absolute difference.

In step S306, the determination logic circuit 204 adjusts a low battery state indicator according to the difference. For example, when the determination logic circuit 204 detects that the difference is greater than or equal to a first threshold, the determination logic circuit 204 may execute an adjustment scheme to adjust the value of the low battery status indicator, such as increasing, decreasing, multiplying with a magnification, or maintaining the value of the low battery state indicator.

In step S308, the determination logic circuit 204 determines whether to output a low battery warning signal $S_{WARN}$ according to the low battery state indicator. For example, when the determination logic circuit 204 detects that the value of the low battery state indicator crosses a second threshold, the determination logic circuit 204 may control the transmitting circuit 206 to output the low battery warning signal $S_{WARN}$. Here, the term cross means going from under to above, or from above to under.

Figure 4:
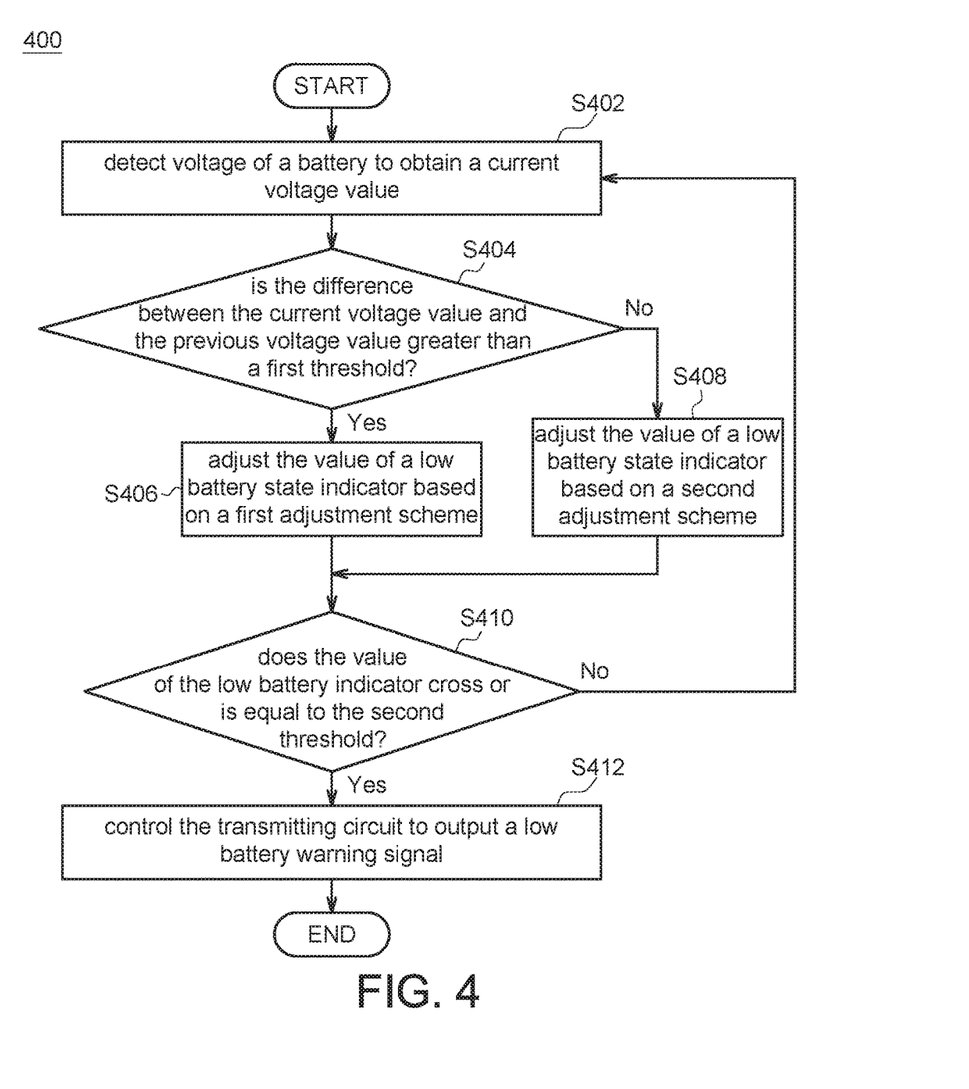
FIG. 4 shows a flowchart of a battery status detection method according to an embodiment of the present invention.

For better comprehension of the proposed network device's battery status detection mechanism, descriptions are given with reference to the flowchart 400 in FIG. 4. However, the flowchart 400 is merely an exemplary embodiment, it is to be understood that the present invention is not limited thereto.

In step S402, the voltage sensor 202 detects voltage of the battery 20 to obtain the current voltage value of the battery 20. While this newly detected voltage value is treated as the current voltage value, its previous value would be treated as the previous voltage value.

In step S404, the determination logic circuit 204 determines whether the difference between the current voltage value and the previous voltage value of the battery 20 is greater than a first threshold. When the determination result of step S404 is "yes", then in step S406, the determination logic circuit 204 adjusts the value of the low battery state indicator based on a first adjustment scheme. For example, the value of the low battery state indicator can be adjusted based on the following equation:

$$I = I + \Delta \quad \text{(equation 1)}$$

where I represents the value of the low battery state indicator. In equation 1, $\Delta$ is added to the value of the low battery state indicator for each time the determination result of step S404 is "yes". For example, $\Delta$ is equal to 1.

When the determination result of step S404 is "no", then in step S408, the determination logic circuit 204 adjusts the value of the low battery state indicator based on a second adjustment scheme. For example, the determination logic circuit 204 decreases the value of the low battery state indicator.

Next, in step S410, the determination logic circuit 204 determines whether the value of the low battery indicator crosses or is equal to the second threshold. If yes, the process goes to step S412, in which the determination logic circuit 204 controls the transmitting circuit 206 to output the low battery warning signal $S_{WARN}$. If not, the process turns back to step S402, in which the determination logic circuit 204 performs detection for the next set of voltage values. For example, the determination logic circuit 204 may adjust the value of the low battery indicator when the difference between the current and previous voltage values is greater than or equal to the first threshold, and controls the transmitting circuit 206 to output the low battery warning signal $S_{WARN}$ when the value of the low battery state indicator crosses the second threshold.

To sum up the flowchart 400, when the network device 200 detects an apparent/drastic difference between the current and previous voltage values (e.g., greater than or equal to the first threshold) of the battery 20, this means that the battery 20 may have possibly entered the voltage jitter stage before the low battery state. In such situation, the determination logic circuit 204 may adjust the value of the low battery state indicator based on the first adjustment scheme (e.g., increasing value) to indicate that the possibility that the battery 20 is in the voltage jitter stage increases. Conversely, when the difference between the current and previous voltage values of the battery 20 is minor (e.g., lower than the first threshold), the battery 20 is possibly in a voltage non-jitter stage. In such situation, the determination logic circuit 204 may adjust the value of the low battery state indicator based on the second adjustment scheme (e.g., decreasing value) to indicate that the possibility that the battery 20 is in the voltage jitter stage decreases. Given that the first adjustment scheme is to increase the value of the low battery state indicator and the second adjustment scheme is to decrease the value of the low battery state indicator, if the value of the low battery state indicator accumulates and crosses the second threshold, it suggests that the battery 20 has already exhibited apparent dense/sustained voltage variations for a period of time. This indicates that the battery 20 is in the stage of voltage jitter, and the network device 200 may transmit the low battery warning signal $S_{WARN}$ to notify the user that the battery 20 is about to lose its power. For example, the notification can be implemented by sending the low voltage warning signal $S_{WARN}$ through the Internet to a remote host, or sending warning signals using sounds or flashing lights.

The aforementioned first and second adjustment schemes can be arbitrary numerical adjustment schemes, such as increments, decrements, or specific rules for adjusting the value of the low battery state indicator, or maintaining the low battery state indicator. The numerical adjustment trends corresponding to the first and second adjustment schemes would vary, for example, with an opposite or negative correlation. For instance, when the first adjustment scheme represents increasing the value of the low battery state indicator, then the second adjustment scheme represents decreasing the value of the low battery state indicator. Alternatively, when the first adjustment scheme represents decreasing the value of the low battery state indicator, then the second adjustment scheme represents increasing the value of the low battery state indicator. When the value of the low battery state indicator is adjusted based on the first adjustment scheme and thus crosses the second threshold, the determination logic circuit 204 may control the transmitting circuit 206 to output the low battery warning signal $S_{WARN}$. For example, if the first adjustment scheme is to increase the value of the low battery state indicator, when the value of the low battery state indicator is greater than or equal to the second threshold, it means that the value of the low battery state indicator has crossed the second threshold, and the determination logic circuit 204 may control the transmitting circuit 206 to output the low battery warning signal $S_{WARN}$. Conversely, if the first adjustment scheme is to decrease the value of the low battery state indicator, when the value of the low battery state indicator is less than or equal to the second threshold, it means that the value of the low battery state indicator has crossed the second threshold, and the determination logic circuit 204 may control the transmitting circuit 206 to output the low battery warning signal $S_{WARN}$.

In another embodiment, when the network device 200 detects that the difference between the current and previous voltage values of the battery 20 is less than the first threshold, the process may directly enter step S410 to compare the low battery state indicator with the second threshold. In such situation, because the value of the low battery state indicator can only increase or change with a fixed trend, one or more second thresholds can be established for the determination. Alternatively, the value of the low battery state indicator can also be reset at specific times.

Figure 5:
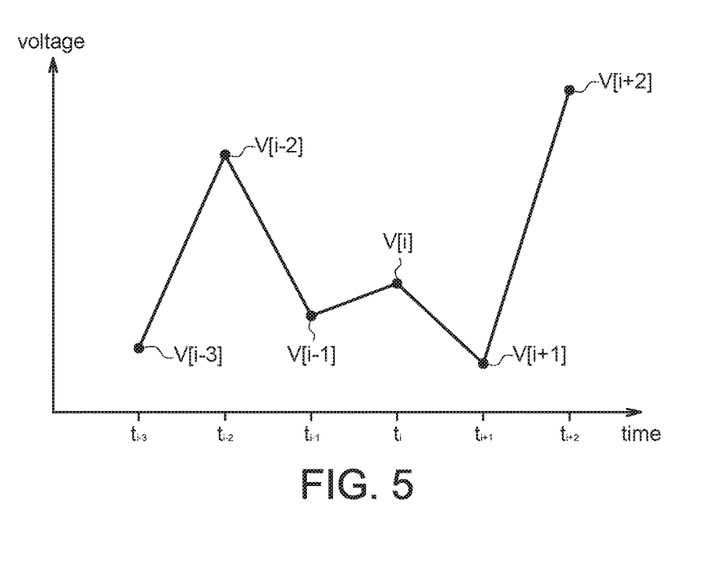
FIG. 5 illustrates a schematic diagram of battery voltages sampled by a given time interval.

FIG. 5 illustrates a schematic diagram of battery voltages sampled by a given time interval. Taking the network device 200 in FIG. 2 as an example, the voltage sensor 202 samples voltage of the battery 20 from time points $t_{i-3}$ to $t_{i+2}$ to obtain voltage values of V[i−3] to V[i+2], respectively.

The determination logic circuit 204 may compare the voltage value at the current sampling time (current voltage value) with the voltage value at the previous sampling time (previous voltage value), and determine whether the difference between them is greater than or equal to the first threshold. For example, if $t_i$ denotes the current time point, the determination logic circuit 204 may compare the voltage value of V[i] with the voltage value of V[i−1] to determine whether the difference between them is greater than or equal to the first threshold.

Alternatively, the determination logic circuit 204 may compare the voltage value at the current sampling time (current voltage value) with the average/weighted average (previous voltage value) of the voltage values obtained in a previous sampling time interval, and determine whether the difference between them is greater than or equal to the first threshold. For example, if $t_i$ denotes the current time point, the determination logic circuit 204 may compare the voltage value of V[i] with the average/weighted average of the voltage values of V[i−1] to V[i−3], to determine whether the difference between the voltage value of V[i] and the average/weighted average voltage value is greater than or equal to the first threshold.

Figure 6:
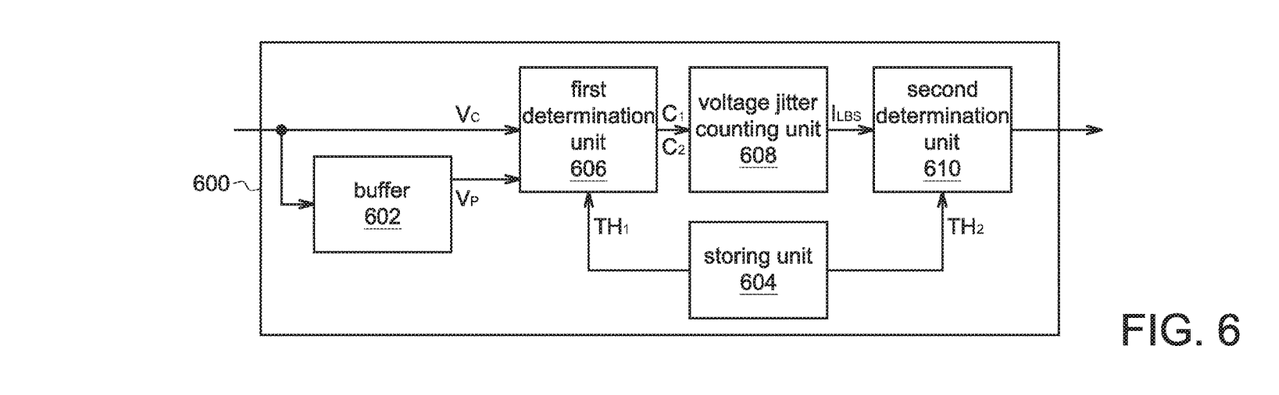
FIG. 6 illustrates a block diagram of a determination logic circuit according to an embodiment of the present invention.

FIG. 6 illustrates a block diagram of a determination logic circuit 600 according to an embodiment of the present invention. The determination logic circuit 600 can be used as the determination logic circuit 204 in FIG. 2, but the present invention is not limited thereto. The determination logic circuit 600 includes a buffer 602, a storing unit 604, a first determination unit 606, a voltage jitter counting unit 608 and a second determination unit 610. The buffer 602 is configured to delay the output of the voltage sensor (e.g., voltage sensor 202 in FIG. 2), so as to provide the previous voltage value VP.

The storing unit 604 is configured to store the first threshold TH1 and the second threshold TH2. For example, the storing unit 604 can be implemented by a look up table (LUT) or a non-volatile memory.

The first determination unit 606, coupled to the buffer 602 and the storing unit 604, is configured to compare the current voltage value $V_C$ with the previous voltage value $V_P$ to obtain the difference between them, and determine whether the difference is greater than or equal to the first threshold $TH_1$, such that the first control signal $C_1$ is outputted when the difference is greater than or equal to the first threshold $TH_1$, and the second control signal $C_2$ is outputted when the difference is less than the first threshold $TH_1$.

The voltage jitter counting unit 608, coupled to the first determination unit 606, is configured to adjust the value of the low battery state indicator $I_{LBS}$ based on the first adjustment scheme (e.g., increasing value) in response to the first control signal $C_1$, and based on the second adjustment scheme (e.g., decreasing value) in response to the second control signal $C_2$. For example, the voltage jitter counting unit 608 may add $\Delta$ to the value of the low battery state indicator $I_{LBS}$ in response to the first control signal $C_1$, and subtract $\Delta$ from the value of the low battery state indicator $I_{LBS}$ in response to the second control signal $C_2$.

The second determination unit 610, coupled to the voltage jitter counting unit 608 and the storing unit 604, is configured to determine whether the value of the low battery state indicator $I_{LBS}$ adjusted by the voltage jitter counting unit 608 crosses the second threshold $TH_2$, and control the transmitting circuit 206 to output the low battery warning signal $S_{WARN}$ when the value of the low battery state indicator $I_{LBS}$ crosses the second threshold $TH_2$.

Figure 7:
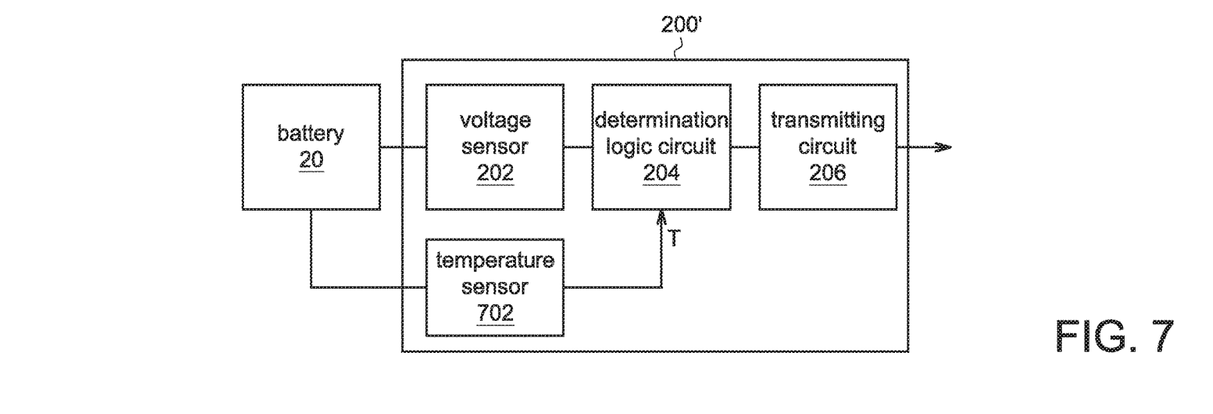
FIG. 7 shows a simplified block diagram of a network device according to an embodiment of the present invention.

FIG. 7 shows a simplified block diagram of a network device 200' according to an embodiment of the present invention. Compared to the network device 200 shown in FIG. 2, the network device 200' further includes a temperature sensor 702. The temperature sensor 702 is configured to detect the temperature T of the battery 20, so that the determination logic circuit 204 may adjust at least one of the first threshold $TH_1$ and the second threshold $TH_2$ according to the temperature T.

Our research shows that when a battery is in relatively high temperatures, the voltage jitter is relatively gentle, e.g., reduced amplitudes and/or frequencies in voltage variations, before the low battery state. Therefore, in an embodiment, the determination logic circuit 204 may reduce the first threshold $TH_1$ and/or the second threshold $TH_2$ when the temperature T of the battery 20 increases, and conversely, increase the first threshold $TH_1$ and/or the second threshold TH$_2$ when the temperature T of the battery 20 decreases, so as to improve the accuracy in determining the voltage jitters.

The battery status detection method and the network device proposed in the present invention utilize the voltage jitter property occurred when a battery approaches the low battery state as a basis for status determination, thereby providing low battery warnings in advance and providing users enough time for battery replacement or other preparations. Moreover, the proposed battery status detection method and network device may dynamically adjust the first and second thresholds required during the determination operation based on the effect of temperature on the voltage jitter properties, thus improving the effectiveness of the battery status detection.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A battery status detection method for a network device to detect whether a battery enters a low battery state, comprising:
   iteratively executing the following steps:
   obtaining a current voltage value and a previous voltage value of the battery by a voltage sensor;
   calculating a difference between the current voltage value and the previous voltage value by a determination logic circuit;
   adjusting a value of a low battery state indicator based on a first adjustment scheme when the difference is greater than or equal to a first threshold by the determination logic circuit; and
   determining whether to control a transmitting circuit to output a low battery warning signal according to the low battery state indicator by the determination logic circuit, wherein when the value of the low battery state indicator crosses a second threshold, the low battery warning signal is output.

2. The battery status detection method according to claim 1, further comprises:
   adjusting at least one of the first threshold and the second threshold according to a temperature of the battery, comprising:
   reducing the first threshold and/or the second threshold when the temperature of the battery increases, and
   increasing the first threshold and/or the second threshold when the temperature of the battery decreases.

3. The battery status detection method according to claim 1, wherein the battery is a button cell battery.

4. The battery status detection method according to claim 1, wherein step of obtaining the current voltage value and the previous voltage value of the battery comprises:
   detecting voltage of the battery by an analog to digital converter to obtain the current voltage value and the previous voltage value of the battery.

5. A battery status detection method for a network device to detect whether a battery enters a low battery state, comprising:
   obtaining a current voltage value and a previous voltage value of the battery by a voltage sensor;
   determining whether a difference between the current voltage value and the previous voltage value is greater than or equal to a first threshold by a determination logic circuit;
   adjusting a value of a low battery state indicator based on a first adjustment scheme when the difference is greater than or equal to the first threshold by the determination logic circuit; and
   outputting a low battery warning signal by a transmitting circuit when the value of the low battery state indicator crosses a second threshold.

6. The battery status detection method according to claim 5, further comprises:
   adjusting at least one of the first threshold and the second threshold according to a temperature of the battery, comprising:
   reducing the first threshold and/or the second threshold when the temperature of the battery increases, and
   increasing the first threshold and/or the second threshold when the temperature of the battery decreases.

7. The battery status detection method according to claim 5, wherein the battery is a button cell battery.

8. The battery status detection method according to claim 5, wherein step of obtaining the current voltage value and the previous voltage value of the battery comprises:
   detecting voltage of the battery by an analog to digital converter to obtain the current voltage value and the previous voltage value of the battery.

9. A network device for battery status detection, comprising:
   a voltage sensor, configured to detect voltage of a battery to obtain a current voltage value and a previous voltage value of the battery;
   a transmitting circuit; and
   a determination logic circuit, configured to determine whether a difference between the current voltage value and the previous voltage value is greater than or equal to a first threshold, adjust a value of a low battery state indicator based on a first adjustment scheme when the difference is greater than or equal to the first threshold, and control the transmitting circuit to output a low battery warning signal when the value of the low battery state indicator crosses a second threshold.

10. The network device according to claim 9, wherein the determination logic circuit comprises:
    a buffer, configured to delay the output of the voltage sensor, so as to provide the previous voltage value;
    a storing unit, configured to store the first threshold and the second threshold;
    a first determination unit, configured to compare the current voltage value with the previous voltage value to obtain the difference, determine whether the difference is greater than or equal to the first threshold, output a first control signal when the difference is greater than or equal to the first threshold, and output a second control signal when the difference is less than the first threshold;
    a voltage jitter counting unit, configured to adjust the value of the low battery state indicator based on a first adjustment scheme in response to the first control signal, and based on a second adjustment scheme in response to the second control signal; and
    a second determination unit, configured to determine whether the value of the low battery state indicator adjusted by the voltage jitter counting unit crosses the second threshold, and control the transmitting circuit to output the low battery warning signal when the value of the low battery state indicator crosses the second threshold.

11. The network device according to claim 10, wherein a numerical adjustment trend of the second adjustment scheme is different from a numerical adjustment trend of the first adjustment scheme.

12. The network device according to claim 9, further comprising:
- a temperature sensor, configured to detect a temperature of the battery;
- wherein the determination logic circuit is further configured to adjust at least one of the first threshold and the second threshold according to the temperature of the battery;
- when the temperature of the battery increases, the determination logic circuit reduces the first threshold and/or the second threshold, and when the temperature of the battery decreases, the determination logic circuit increases the first threshold and/or the second threshold.

13. The network device according to claim 9, wherein the battery is a button cell battery.

14. The network device according to claim 9, wherein the voltage sensor is an analog to digital converter.

* * * * *